United States Patent
Kawago et al.

(10) Patent No.: US 7,271,619 B2
(45) Date of Patent: Sep. 18, 2007

(54) CHARGE PUMP CIRCUIT REDUCING NOISE AND CHARGE ERROR AND PLL CIRCUIT USING THE SAME

(75) Inventors: Hiroshi Kawago, Tokyo (JP); Haruhiko Otsuka, Tokyo (JP)

(73) Assignee: Seiko NPC Corporation, Tokyo (JP)

( * ) Notice: Subject to any disclaimer, the term of this patent is extended or adjusted under 35 U.S.C. 154(b) by 42 days.

(21) Appl. No.: 11/109,299

(22) Filed: Apr. 18, 2005

(65) Prior Publication Data
US 2005/0237092 A1 Oct. 27, 2005

(30) Foreign Application Priority Data
Apr. 27, 2004 (JP) ............................. 2004-132017

(51) Int. Cl.
*H03K 19/094* (2006.01)
*H03K 19/0175* (2006.01)

(52) U.S. Cl. ............................ 326/87; 326/88; 326/92; 327/148; 327/157

(58) Field of Classification Search ................ 326/93, 326/87–88, 91–92; 327/147–148, 156–157; 331/14, 17–18
See application file for complete search history.

(56) References Cited

U.S. PATENT DOCUMENTS

| | | | |
|---|---|---|---|
| 6,222,402 B1 * | 4/2001 | Boerstler et al. ............ | 327/157 |
| 6,710,666 B1 * | 3/2004 | Wu et al. ..................... | 331/17 |
| 6,759,912 B2 | 7/2004 | Yamagishi et al. | |
| 2001/0028694 A1 * | 10/2001 | Kushibe ..................... | 375/376 |

FOREIGN PATENT DOCUMENTS

JP 2000-036741 2/2000

OTHER PUBLICATIONS

A Variable Delay Line PLL for CPU-Coprocessor Synchronization Mark G. Johnson, Member, IEEE, and Edwin L. Hudson, Member IEEE IEEE Journal of Solid-State Circuits, vol. 23. No. 5, Oct. 1988.

* cited by examiner

*Primary Examiner*—Anh Q. Tran
(74) *Attorney, Agent, or Firm*—Jordan and Hamburg LLP (57) ABSTRACT

Operation noise and charge error of a charge pump circuit are reduced, thereby the jitter characteristics and the spectrum characteristics of a PLL circuit are improved, and further a time period elapsed until the PLL circuit is locked is shortened. The charge pump circuit 36 receives a control signal depending on an output of a phase comparison circuit 34 from a control circuit 35, and comprises a first P-channel MOS transistor P1, a second P-channel MOS transistor P2 and a third P-channel MOS transistor P3, and a first N-channel MOS transistor N1, a second N-channel MOS transistor N2 and a third N-channel MOS transistor N3, and a first current source 61, a second current source 62, a third current source 63 and a fourth current source 64. The transistor P1 is turned on and off by an up-signal of the phase comparison circuit 34, and the transistor N1 is turned on and off by a down-signal of it, and each of the transistor P2, the transistor P3, the transistor N2 and the transistor N3 is turned on and off on the basis of the control signal of the control circuit 35, an output signal from a VCO control terminal 65 is input to a VCO 8 through a low pass filter 37 while causing current to flow through the charge pump circuit 36.

7 Claims, 11 Drawing Sheets

CHARGE PUMP CIRCUIT REDUCING NOISE AND CHARGE ERROR AND PLL CIRCUIT USING THE SAME

BACKGROUND OF THE INVENTION

1. Field of the Invention

The present invention relates to a current output type charge pump circuit and a PLL circuit using the charge pump circuit.

2. Related Background Art

Figure 1:
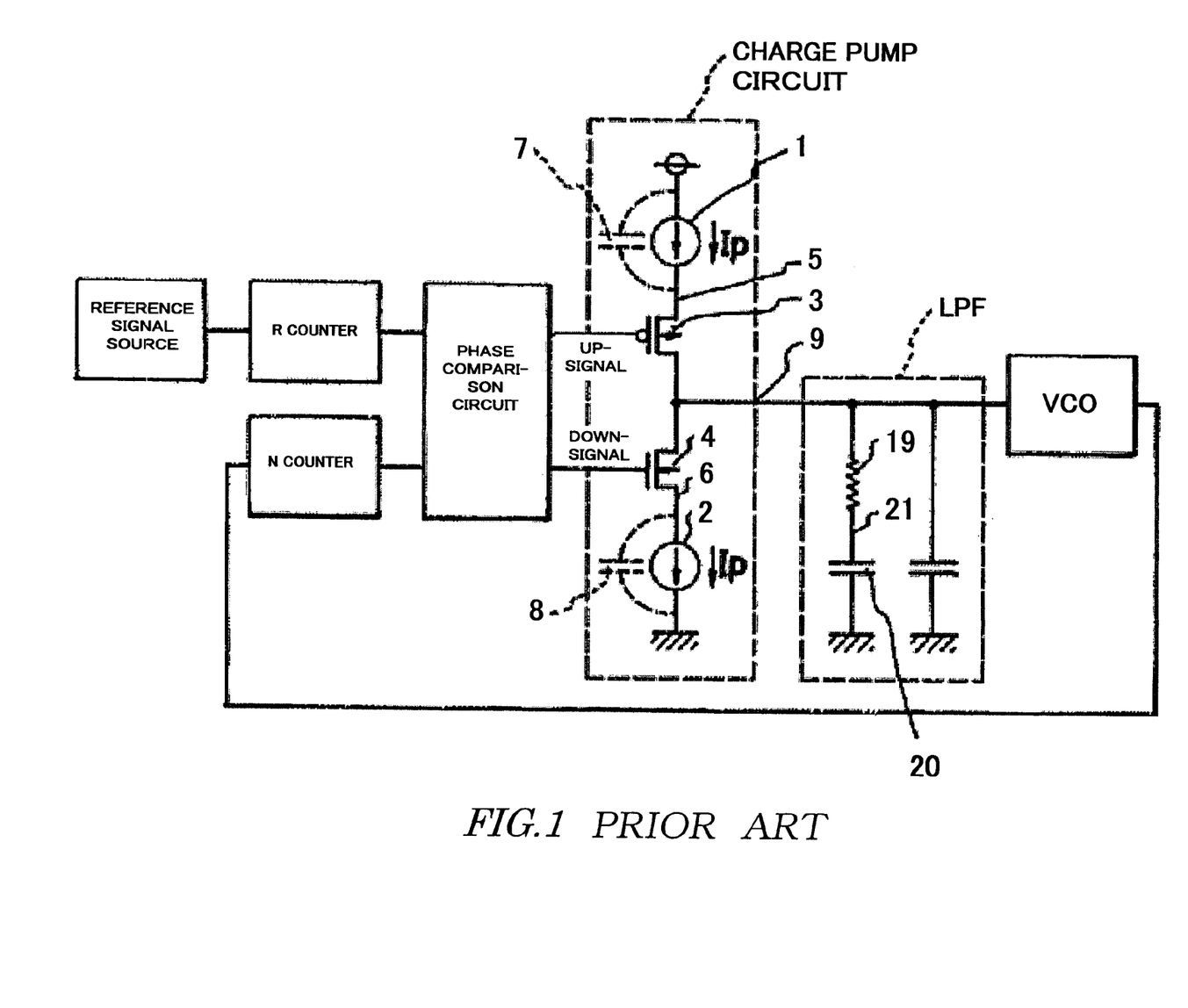
FIG. 1 is a circuit diagram showing an example of the conventional configuration of a PLL circuit.

A Phase-Locked Loop(PLL) circuit using a conventional charge pump circuit is shown in FIG. 1. The PLL circuit is so configured that a phase difference between a signal obtained by dividing a signal with the predetermined frequency generated from a reference signal source using an R counter and a signal obtained by dividing a signal of a voltage controlled oscillator circuit(VCO) using an N counter is detected by a phase comparison circuit, an up-signal and a down-signal depending on the phase difference from the phase comparison circuit carry out on and off switching of a MOS transistor 3 and a MOS transistor 4 between a current sources 1 and a current source 2 respectively connected to a power supply terminal and a ground terminal, and the signal output by on and off of the MOS transistors is smoothed by a low pass filter (LPF) connected to the VCO control terminal 9 and is input to the VCO.

According to the PLL circuit shown in FIG. 1, current flowing through the charge pump circuit is approximately zero in a state where both the up-signal and the down-signal turn the MOS transistor 3 and the MOS transistor 4 off (hereinafter referred to as a hold state), while current Ip flows through the charge pump circuit in a state where the up-signal turns the MOS transistor 3 on and the down-signal turns the MOS transistor 4 off (hereinafter referred to as a charge state), in a state where the up-signal turns the MOS transistor 3 off and the down-signal turns the MOS transistor 4 on (hereinafter referred to as a discharge state), and in a state where both the up-signal and the down-signal turn the MOS transistor 3 and the MOS transistor 4 on (hereinafter referred to as a charge/discharge state). Therefore, the current flowing through the charge pump circuit is changed by an on/off operation of each of the MOS transistor 3 and the MOS transistor 4 by the up-signal and the down-signal. Thus, the operation noise of the charge pump circuit is put on a power supply, which may adversely affect the jitter characteristics and the spectrum characteristics of the whole PLL circuit.

In the hold state, a potential at a source 5 of the MOS transistor 3 is approximately equal to a power supply potential, and a potential at a source 6 of the MOS transistor 4 is approximately equal to a ground potential. Here, assuming that the operating state of the PLL circuit is close to a lock state where the phase difference between the signal obtained by dividing the signal of the VCO using the N counter and the signal obtained by dividing the signal with the predetermined frequency generated from the reference signal source using the R counter is zero, a potential at the VCO control terminal 9 is close to an intermediate potential between the potential at the source 5 of the MOS transistor 3 and the potential at the source 6 of the MOS transistor 4. Since a parasitic capacitance 7 and a parasitic capacitance 8 exist in the current source 1 and the current source 2 respectively, in a case where the transition from the hold state to the charge state occurs, charges may flow from the parasitic capacitance 7 in the current source 1 due to a potential difference between the potential at the source 5 of the MOS transistor 3 and the potential at the VCO control terminal 9, and current which is more than current Ip may instantaneously flow into the VCO control terminal 9 (hereinafter referred to as a charge error). Similarly in a case where the transition from the hold state to the discharge state and the charge/discharge state occurs, the charge error caused by sharing charges may occur between the source 6 of the MOS transistor 4 and the VCO control terminal 9. When the charge error occurs, bigger current than current intended by a designer instantaneously flows, which may adversely affect the jitter characteristics, etc of the PLL circuit.

Figure 2:
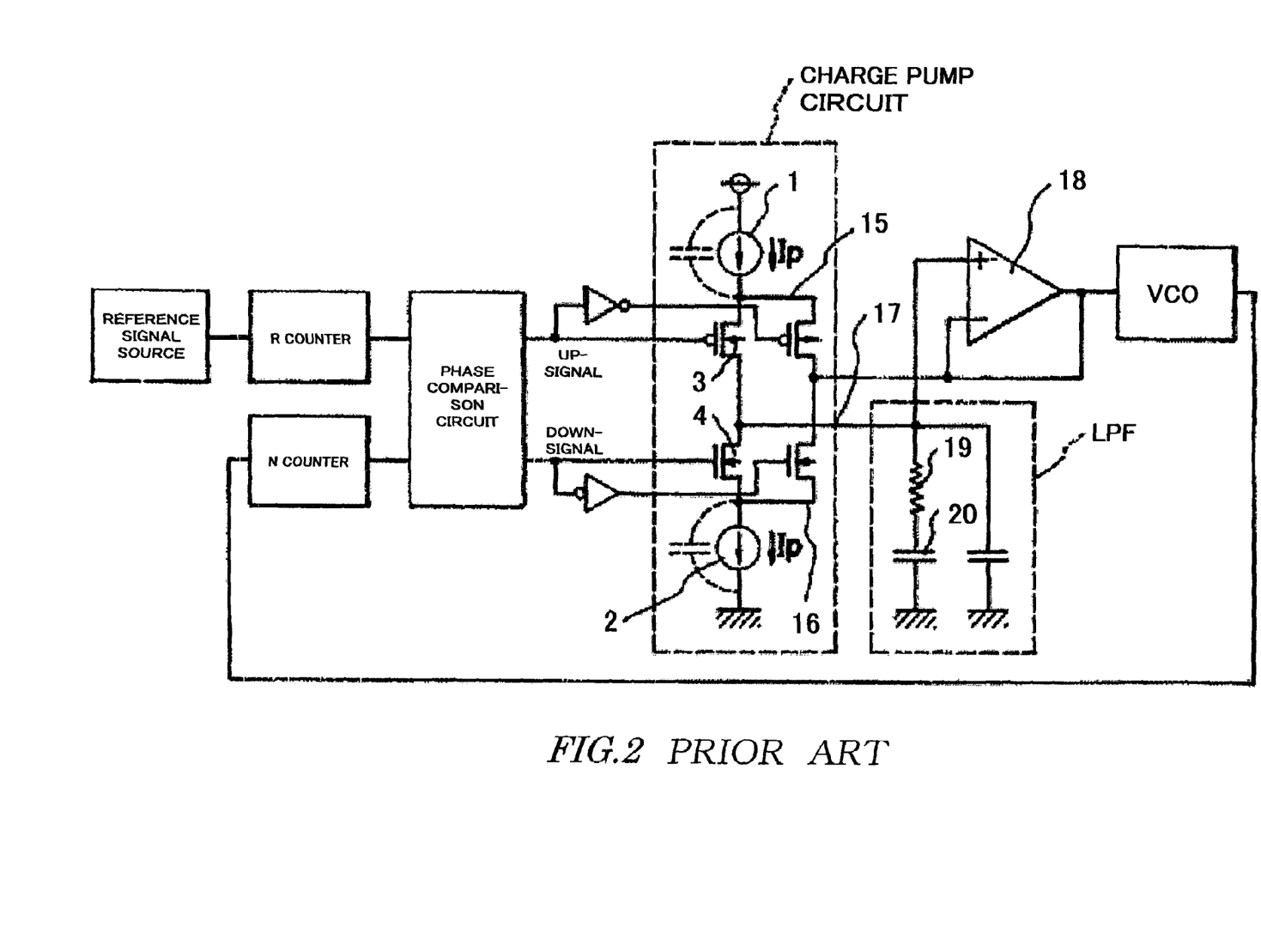
FIG. 2 is a circuit diagram showing an example of another conventional configuration of the PLL circuit.

In another conventional example of the PLL circuit shown in FIG. 2, the potential at 15 and the potential 16 are controlled to be equal to the potential at an output terminal 17 by a voltage follower when both the MOS transistor 3 and the MOS transistor 4 are off in addition to the operations shown in FIG. 1. According to the PLL circuit shown in FIG. 2, as to a charge error, since the potential at 15 and the potential at 16 in a hold state are approximately equal to the potential at the output terminal 17, the charge error can be restrained. However, an operational amplifier 18 having a sufficient driving capability is required, so that a wide layout area is adversely required.

According to the PLL circuit shown in FIG. 1 and FIG. 2, described above, the value of Ip cannot be increased to improve the phase margin and the jitter characteristics of the PLL circuit in the lock state. Further, current for charging or discharging a capacitance 20 is restricted by a resistor 19, so that it takes a lot of time until the PLL circuit is in the lock state.

See Japanese Unexamined Patent Application No. 2000-36741, and an article entitled "A variable Delay Line PLL for CPU-Coprocessor Synchronization", US, IEEE Journal of Solid-State Circuits, Vol. 23, No. 5, October 1988, pp. 1218~1223.

SUMMARY OF THE INVENTION

An object of the present invention is to solve the above-mentioned conventional disadvantage and to provide a charge pump circuit that improves the jitter characteristics and the spectrum characteristics of a PLL circuit by reducing its operation noise and charge error and further shortens a time period elapsed until the PLL circuit is locked.

In order to attain the above-mentioned object, a charge pump circuit according an embodiment of the present invention comprises a first P-channel MOS transistor having a source, a drain connected to an output terminal and a gate receiving a first signal, and a first N-channel MOS transistor having a source, a drain connected to the output terminal and a gate receiving a second signal, and a second P-channel MOS transistor having a source connected to the source of the first P-channel MOS transistor, a drain and a gate receiving an inverted signal level of the first signal, for example, if one signal is at an "H" level, the other signal is at an "L" level, and a second N-channel MOS transistor having a source connected to the source of the first N-channel MOS transistor, a drain and a gate receiving an inverted signal level of the second signal, and a first current source for providing a current of first level to the source of the first P-channel MOS transistor, and a second current source for providing a current of second level to the source of the first N-channel MOS transistor, and a third current source for providing a current of third level to the drain of die second N-channel MOS transistor, and a fourth current source for providing a current of fourth level to the drain of the second P-channel MOS transistor.

In order to attain the above-mentioned object, a charge pump circuit according the invention provides an output through a first output terminal to a low pass filter(LPF) having a resistor and a first capacitance that are connected in series between the first output terminal and a ground terminal, and a second capacitance connected in parallel to the first capacitance between the first output terminal and the ground terminal, and comprises a first P-channel MOS transistor having a source, a drain connected to the first output terminal and a gate receiving a first signal, and a first N-channel MOS transistor having a source, a drain connected to the first output terminal and a gate receiving a second signal, and a third P-channel MOS transistor having a source, a drain connected to a second output terminal which is connected between the resistor and the first capacitance, and a gate receiving the first signal, and a third N-channel MOS transistor having a source, a drain connected to the second output terminal and a gate receiving the second signal, and a first current source for-providing a current of first level to the source of the first P-channel MOS transistor, and a second current source for providing a current of second level to the source of the first N-channel MOS transistor, and a third current source for providing a current of third level to the source of the third P-channel MOS transistor, and a fourth current source for providing a current of fourth level to the source of the third N-channel MOS transistor.

In order to attain the above-mentioned object, a charge pump circuit according to the invention receives a control signal depending on an output of a phase comparison circuit from a control circuit that receives a first signal, a second signal and a lock detected signal(LD signal) of the phase comparison circuit output while a phase-locked circuit being in the lock state, and comprises a first P-channel MOS transistor having a source, a drain connected to a first output terminal and a gate receiving the first signal, and a first N-channel MOS transistor having a source, a drain connected to the first output terminal and a gate receiving the second signal, and a second P-channel MOS transistor having a source connected to the source of the first P-channel MOS transistor, a drain and a gate receiving an inverted signal level of the first signal while the LD signal being provided, and a second N-channel MOS transistor having a source connected to the source of the first N-channel MOS transistor, a drain and a gate receiving an inverted signal level of the second signal while the LD signal being provided, and a third P-channel MOS transistor having a source connected to the drain of the second N-channel MOS transistor, a drain connected to a second output terminal and a gate receiving the first signal while the LD being not provided, and a third N-channel MOS transistor having a source connected to the drain of the second P-channel MOS transistor, a drain connected to the second output terminal and a gate receiving the second signal while the LD signal being not provided, and a first current source for providing a current of first level to the source of the first P-channel MOS transistor, and a second current source for providing a current of second level to the source of the first N-channel MOS transistor, and a third current source for providing a current of third level to the drain of the second N-channel MOS transistor, and a fourth current source for providing a current of fourth level to the drain of the second P-channel MOS transistor.

In order to attain the above-mentioned object, a PLL circuit according to a further feature of the invention bus the charge pump circuit according to any one of the above discussed configurations for outputting a current depending on output signals of the control circuit and the phase comparison circuit, and comprises a voltage controlled oscillator(VCO) circuit for outputting a signal depending on the voltage level of an input signal, and a reference signal source for generating a reference signal, and a first frequency division circuit for dividing a frequency of the reference signal, and a second frequency division circuit for dividing a frequency of the signal of the VCO circuit, and the phase comparison circuit for comparing the phase of output signals of both the frequency division circuits to output an up-signal and a down-signal, and for detecting a lock state to the LD signal, and the control circuit for outputting the control signal depending on the output signal of the phase comparison circuit, and a LPF for attenuating a high frequency component of an output signal of the charge pump circuit to pass only a low frequency component to the VCO circuit.

In the PLL circuit using the charge pump circuit according to the present invention, current flows through the charge pump circuit in all operating states and charge error is reduced by restraining the charge share in a lock state, so that noise is reduced, anti the jitter characteristics and the spectrum characteristics of the PLL circuit are improved. In the PLL circuit using the charge pump circuit according to the second embodiment of the present invention, the potential of the second output terminal in the charge pump circuit can be directly charged or discharged to the first capacitance in the low pass filter without going through the resistor in an unlock state, so that a time period elapsed until the PLL circuit is locked is shortened. Further, in the PLL circuit using the charge pump circuit according to the third embodiment of the present invention, there is no necessity of adding a complicated and large circuit such as the operational amplifier, etc. in the conventional example in order to reduce operation noise, and the layout area is prevented from being increased by sharing current sources for lockup and noise reduction.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 3:
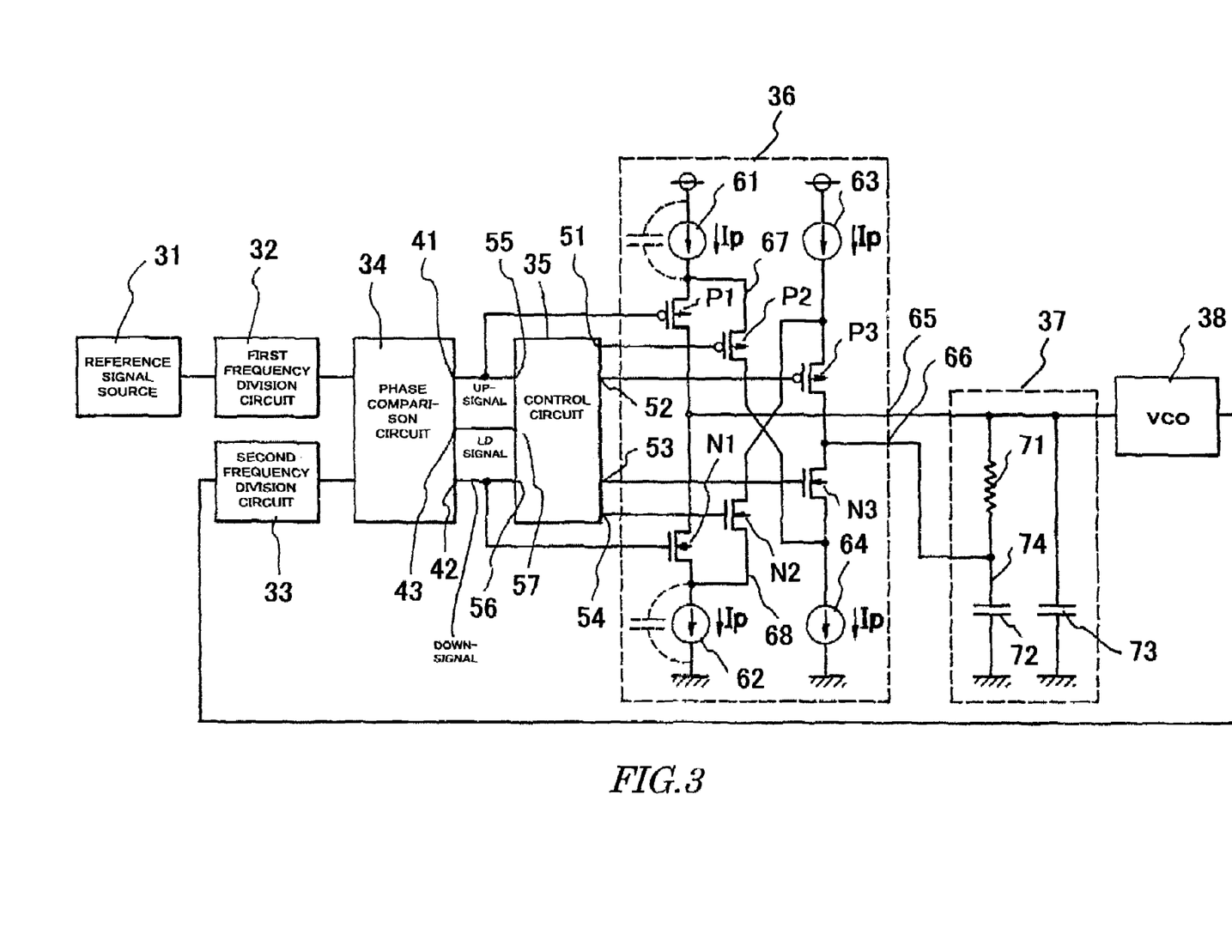
FIG. 3 is a circuit diagram showing the overall configuration of a PLL circuit according to the present invention.

A suitable embodiment of the present invention will be described with reference to the accompanying drawings. FIG. 3 is a circuit diagram showing the overall configuration of a PLL circuit according to the present invention. The PLL circuit comprises a reference signal source 31 for generating a reference signal, a first frequency division circuit 32 for dividing the frequency of the reference signal, a second frequency division circuit 33 for dividing the frequency of an oscillation signal of a VCO 38 described later, a phase comparison circuit 34 for comparing the phase of output signals of the first frequency division circuit 32 and the second frequency division circuit 33 to output an up-signal and a down-signal, and for detecting a lock state to output an LD signal, a control circuit 35 for outputting a control signal dependent on the output signal of the phase comparison circuit 34, a charge pump circuit 36 for being in a hold state, in a charge state, in a discharge state or in a charge/ discharge depending on the control signal of the control circuit 35 and the output signal of the phase comparison circuit 34, and for outputting current dependent on each of the states, a low pass filter 37 for attenuating a high frequency component of an output signal of the charge pump circuit 36 to pass only a low frequency component, and a VCO 38 for operating so that the difference with the output signal of the first frequency division circuit 32 may be reduced depending on the voltage level of an output signal of the low pass filter 37, and for outputting the oscillation signal.

The configuration of the charge pump circuit 36 will be then further described on the basis of FIG. 3. A first P-channel MOS transistor P1 has a source connected to a first current source 61, a drain connected to a first output terminal, i.e., VCO control terminal 65 which outputs the signal to the VCO 38 through the low pass filter 37 and a gate receiving a first signal corresponding to an up-signal output from the phase comparison circuit 34. A first N-channel MOS transistor N1 has a source connected to a second current source 62, a drain connected to the VCO control terminal 65 and a gate receiving a second signal corresponding to an down-signal output from the phase comparison circuit 34.

A second P-channel MOS transistor P2 has a source connected to the source of the first P-channel MOS transistor P1, a drain connected to a fourth current source 64 and a gate connected to the control circuit 35. A second N-channel MOS transistor N2 has a source connected to the source of the first N-channel MOS transistor N1, a drain connected to a third current source 63 and a gate connected to the control circuit 35.

A third P-channel MOS transistor P3 has a source connected to the third current source 63, a drain connected to a second output terminal 66 which is connected between a resistor 71 and a first capacitance 72, described later, in the low pass filter 37 and a gate connected to the control circuit 35. A third N-channel MOS transistor N3 has a source connected to the fourth current source 64, a drain connected to the second output terminal 66 and a gate connected to the control circuit 35.

As shown in FIG. 3, the control circuit 35 has three input terminals, i.e., a first input terminal 55, a second input terminal 56, and a third input terminal 57 respectively receiving the up-signal, the down-signal and the LD signal that are output signals of the phase comparison circuit 34. The LD signal is output while the phase comparison circuit 34 detects a lock state of the PLL circuit. And the control circuit 35 has four output terminals, i.e., a first output terminal 51, a second output terminal 52, a third output terminal 53 and a fourth output terminal 54. The first output terminal 51 is connected to the gate of the second P-channel MOS transistor P2 and outputs an inverted signal level of the up-signal while the LD signal being provided. The second output terminal 52 is connected to the gate of the third P-channel MOS transistor P3 and outputs the up-signal while the LD signal being not provided. The third output terminal 53 is connected to the gate of the third N-channel MOS transistor N3 and outputs the down-signal while the LD signal being not provided. The fourth output terminal 54 is connected to the gate of the second N-channel MOS transistor N2 and outputs an inverted signal level of the down-signal while the LD signal being provided.

Description is herein made of a common constant current source circuit for supplying a constant current to each of the current source 61, the current source 62, the current source 63 and the current source 64, described above, on the basis of FIG. 4. A positive side of a power supply battery 91 is connected to a gate of a P-channel MOS transistor P11 (hereinafter referred to as a transistor P11), and a negative side thereof is connected to a ground terminal. The transistor P11 has a source connected to a positive power supply terminal, and a drain connected to a drain of a N-channel MOS transistor N11 (hereinafter referred to as a transistor N11). The transistor N11 has a source connected to the ground terminal, and a gate connected to the drain of the transistor N11 and connected to each gate of a N-channel MOS transistor N12, a N-channel MOS transistor N13 and a N-channel MOS transistor N14 (hereinafter respectively referred to as a transistor N12, a transistor N13 and a transistor N14). The transistor N12 has a source connected to the ground terminal, and a drain connected to a drain and a gate of a P-channel MOS transistor P12 (hereinafter referred to as a transistor P12). The transistor P12 has a source connected to the positive power supply terminal, and a gate connected to each gate of a P-channel MOS transistor P13 and a P-channel MOS transistor P14 (hereinafter respectively referred to as a transistor P13 and a transistor P14). The transistor P13 has a source connected to the positive power supply terminal, and a drain connected to each source of the transistor P1 and the transistor P2. Further, the transistor P14 has a source connected to the positive power supply terminal, and a drain connected to source of the transistor P3. On the other hand, the transistor N13 has a source connected to the ground terminal, and a drain connected to each source of the transistor N1 and the transistor N2. Further, the transistor N14 has a source connected to the ground terminal, and a drain connected to the source of the transistor N3.

Figure 4:
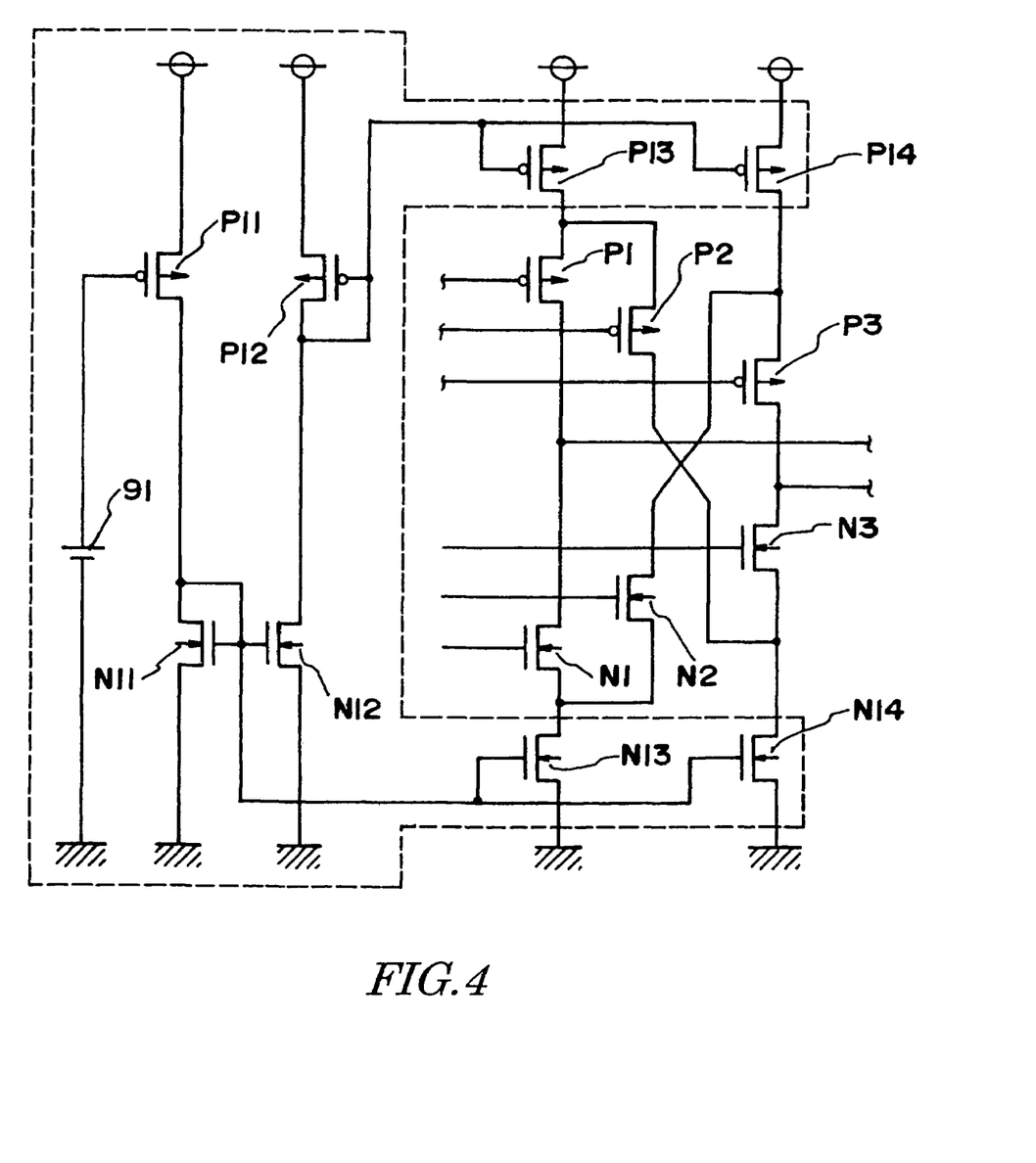
FIG. 4 is a circuit diagram showing an example of a constant current source circuit.

In the above-mentioned configuration, a constant voltage is always supplied from the power supply battery 91 to the gate of the transistor P11. When the transistor P11 is turned on, each of the transistor N11 and the transistor N12 is turned on, and each of the transistor N13 and the transistor N14 is also turned on. At this time, a gate potential at each of the transistor N11, the transistor N12, the transistor N13 and the transistor N14 is constant level. Further, the transistor N12 is turned on, so that the transistor P12 is turned on, and each of the transistor P13 and the transistor P14 is also turned on. At this time, a gate potential at each of the transistor P12, the transistor P13 and the transistor P14 also is constant level. Thus, a constant current can be provided through each of the transistor P13, the transistor P14, the transistor N13 and the transistor N14. That is, a configuration for providing current through the transistor P13 corresponds to the first current source 61, a configuration for providing current through the transistor P14 corresponds to the third current source 63, a configuration for providing current through the transistor N13 corresponds to the second current source 62 and a configuration for providing current through the transistor N14 corresponds to the fourth current source 64.

The configuration of the low pass filter 37 will be then described on the basis of FIG. 3. The low pass filter 37 has a resistor 71 and a first capacitance 72 that are connected in series between the VCO control terminal 65 and the ground terminal, and a second capacitance 73 connected in parallel to the first capacitance 72 between the VCO control terminal 65 and the ground terminal. Further, the drain of the transistor P3 and the transistor N3 are connected between the resistor 71 and the first capacitance 72 through the second output terminal 66. For example, the resistance value of the resistor 71 is 29.9 kΩ, the capacitance value of the first capacitance 72 is 450.0 pF, and the capacitance value of the second capacitance 73 is 15.8 pF. Although the end of the first capacitance 72 is connected to the ground terminal in the present embodiment, it can be also connected to the power supply terminal.

The operations of the above-mentioned PLL circuit will be then described. Description is now made of the case of an unlock state. In FIG. 3, as an output of the control circuit 35 in the unlock state, a potential at the first output terminal 51 is at an "H" level, a potential at the fourth output terminal 54 is at an "L" level, a potential at the second output terminal 52 is the same as that of the up-signal and a potential at the third output terminal 53 is the same as that of the down-signal. Therefore, the transistor P2 and the transistor N2 are off. An equivalent circuit of the charge pump circuit 36 and the low pass filter 37 in this state is illustrated in FIG. 5 and FIG. 6.

In the hold state, the transistor P1, the transistor P3, the transistor N1 and the transistor N3 are turned off, thereby the VCO control terminal 65 is in a high impedance.

Figure 5:
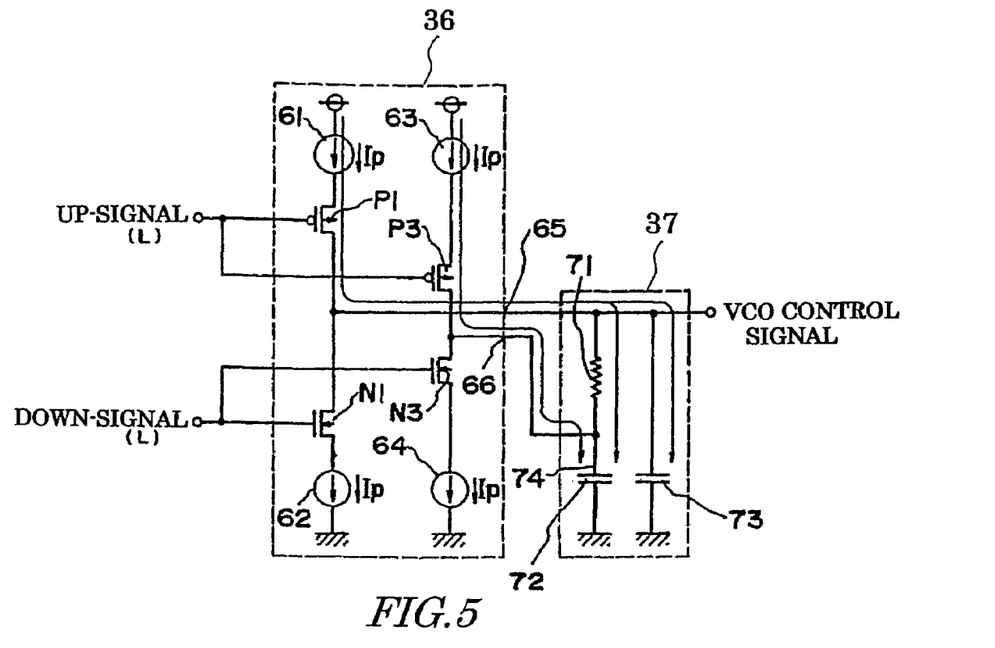
FIG. 5 is an explanatory view showing a current path in a charge state at the time of unlocking of the PLL circuit.
Figure 6:
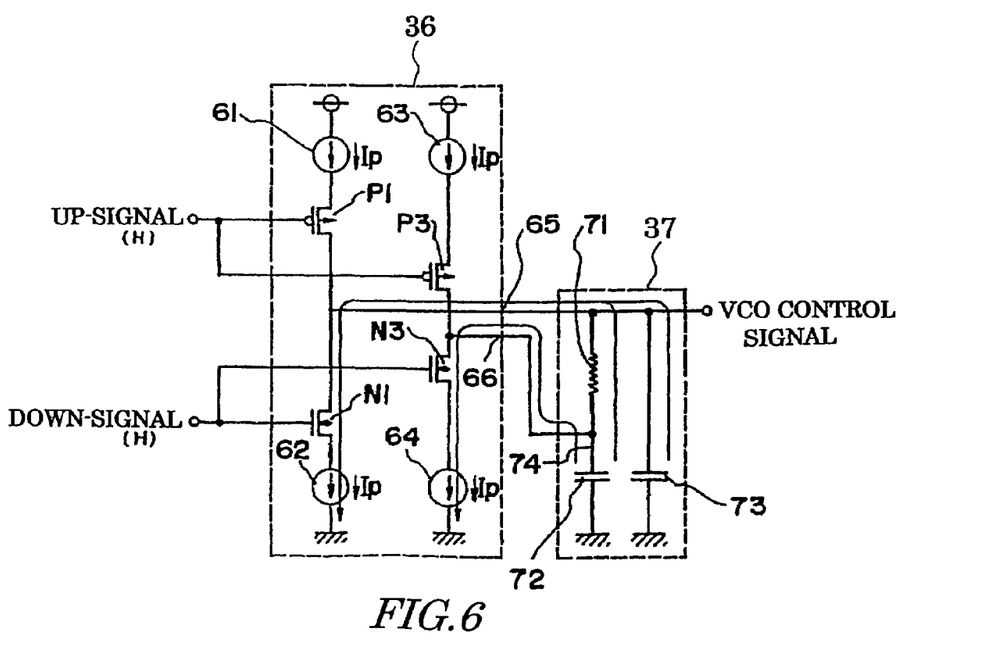
FIG. 6 is an explanatory view showing a current path in a discharge state at the time of unlocking of the PLL circuit.
Figure 11:
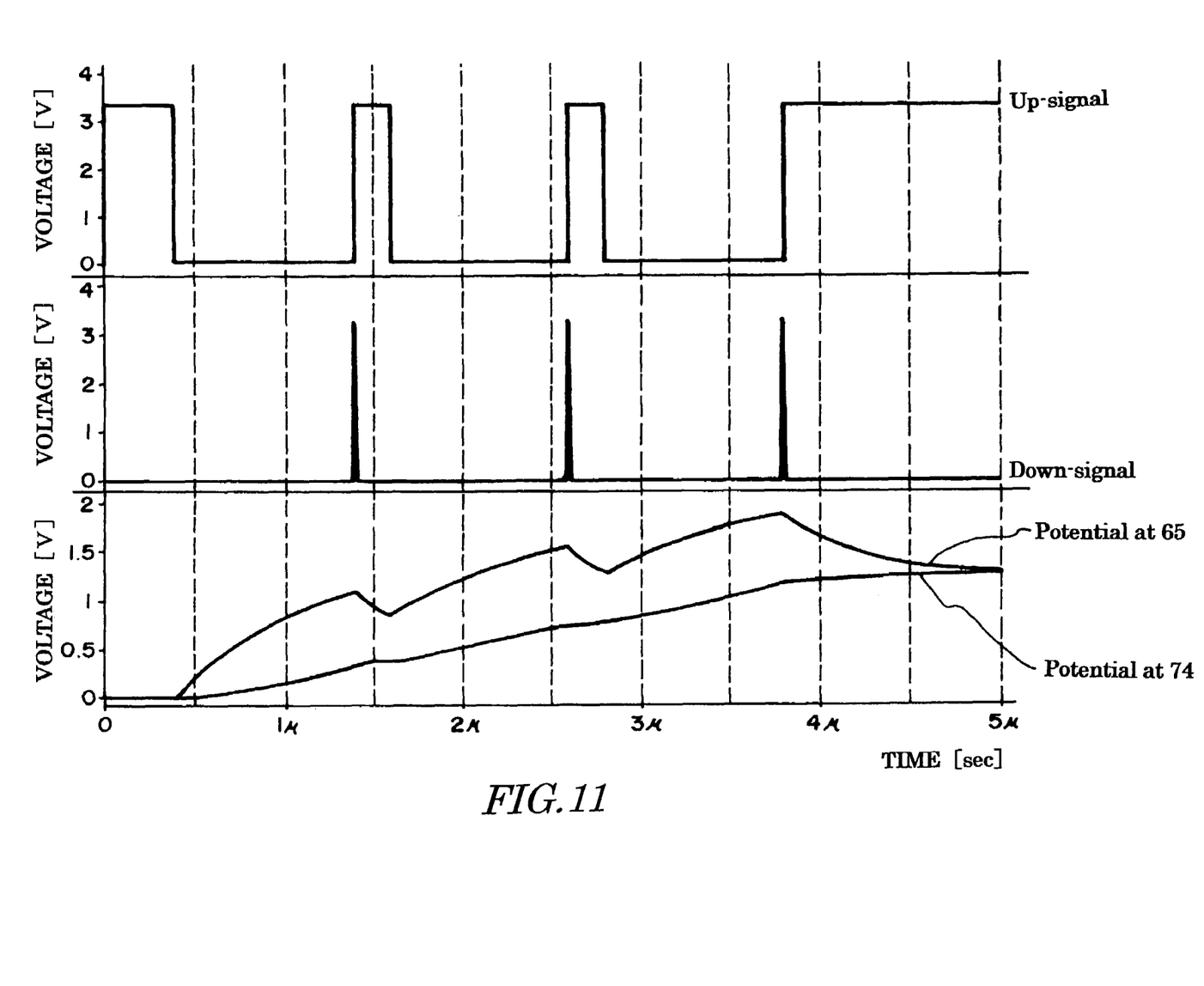
FIG. 11 is a waveform diagram showing a charging operation at the time of unlocking of the PLL circuit.
Figure 12:
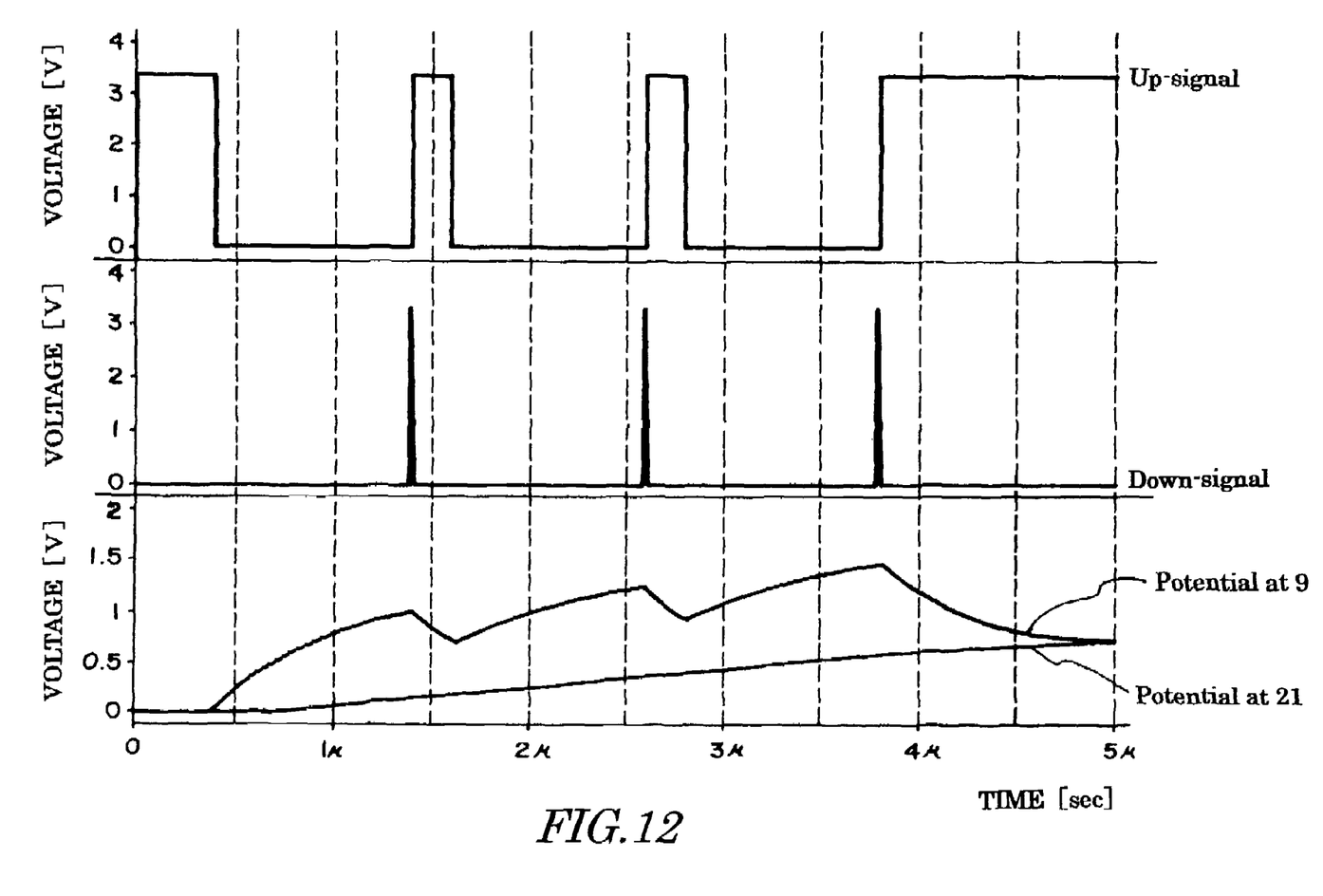
FIG. 12 is a waveform diagram showing a charging operation at the time of unlocking of the PLL circuit in a conventional example shown in FIG. 1.

In the charge state, the transistor P1 and the transistor P3 are turned on, and the second capacitance 73 is charged with current Ip through the transistor P1 and the first capacitance 72 is charged with current Ip through the transistor P1 and the resistor 71, as shown in FIG. 5. Further, the first capacitance 72 is charged with current Ip through the transistor P3 and without going through the resistor 71. FIG. 11 shows a charging operation waveform in the PLL circuit according to the above-mentioned present embodiment, and FIG. 12 shows a charging operation waveform in the PLL circuit shown in FIG. 1. As can be understood if FIG. 11 and FIG. 12 are compared with each other, a potential at the VCO control terminal 65 in the present embodiment can be charged approximately twice as much as that in the conventional example.

When an attempt to shorten a lockup time (pull-in time) is made, the effect of restraining a charge error is lowered but the lockup time can be shortened by increasing the size of each of the current source 61 and the current source 63 for charging the first capacitance 72.

In the discharge state, the transistor N1 and the transistor N3 are turned on, the second capacitance 73 is discharged with current Ip through the transistor N1 and the first capacitance 72 is discharged with current Ip through the transistor N1 and the resistor 71. Further, the first capacitance 72 is discharged with current Ip through the transistor N3 and without going through the resistor 71.

In the charge/discharge state, the transistor P1, the transistor P3, the transistor N1 and the transistor N3 are turned on, so that charging and discharging are simultaneously performed. However, since current limit is made, current does not flow more than twice as much as Ip through the charge pump circuit 36. The charge/discharge state occurs for a very short time period for every comparison cycle in the phase comparison circuit 34.

Description is now made of the case of a lock state. In FIG. 3, as an output of the control circuit 35 in the lock state, a potential at the second output terminal 52 is at an "H" level, a potential at the third output terminal 53 is at an "L" level, a potential at the first output terminal 51 is an inversion of that of the up-signal, and a potential at the fourth output terminal 54 is an inversion of that of the down-signal. Therefore, the transistor P3 and the transistor N3 are off. An equivalent circuit of the charge pump circuit 36 in this state is illustrated in FIG. 7 to FIG. 10.

Figure 7:
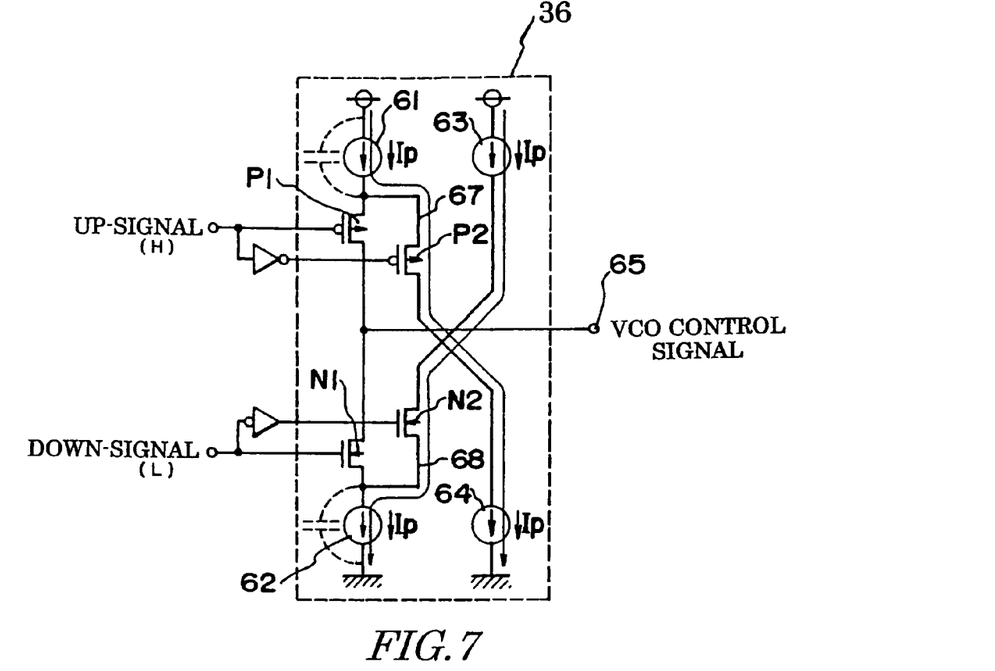
FIG. 7 is an explanatory view showing a current path in a hold state at the time of locking of the PLL circuit.

In the hold state, each of the transistor P2 and the transistor N2 is turned on, and each of the transistor P1 and the transistor N1 is turned off, as shown in FIG. 7. At this time, the VCO control terminal 65 is in a high impedance, however, constant current flows through each of the transistor P2 and the transistor N2 in the charge pump circuit 36. Further, each potential at the source 67 of the transistor P2 and at the source 68 of the transistor N2 is an intermediate potential determined by the current source 61, the current source 64, the current source 63 and the current source 62, and if the sizes of these current sources are equal to each other, both potentials at the source 67 and at the source 68 are approximately equal.

Figure 8:
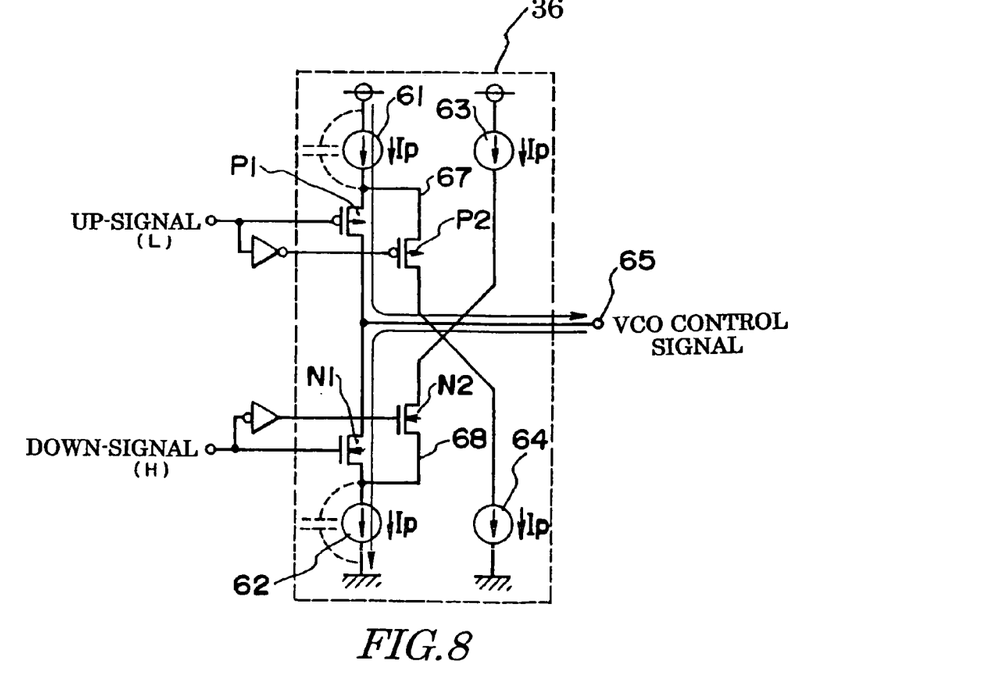
FIG. 8 is an explanatory view showing a current path in a charge/discharge state at the time of locking of the PLL circuit.

When the transition from the hold state to the charge/discharge state occurs, each of the transistor P1 and the transistor N1 is turned on, and each of the transistor P2 and the transistor N2 is turned off, as shown in FIG. 8. In the lock state, a potential at the VCO control terminal 65 is an approximately intermediate potential, therefore, the VCO control terminal 65 and the source 67 of the transistor P1 and the source 68 of the transistor N1 are connected to each other with a small potential difference, so that charge error caused by sharing charges resulted from parasitic capacitances of the current source 61 and the current source 62 is reduced. Since both a potential at the source 67 of the transistor P1 and a potential at the source 68 of the transistor N1 are approximately equal to each other, the sharing charges does not occur.

In both the hold state and the charge/discharge state, current flows through the charge pump circuit 36, so that there is little effect of noise to the power supply depending on a state change.

Figure 9:
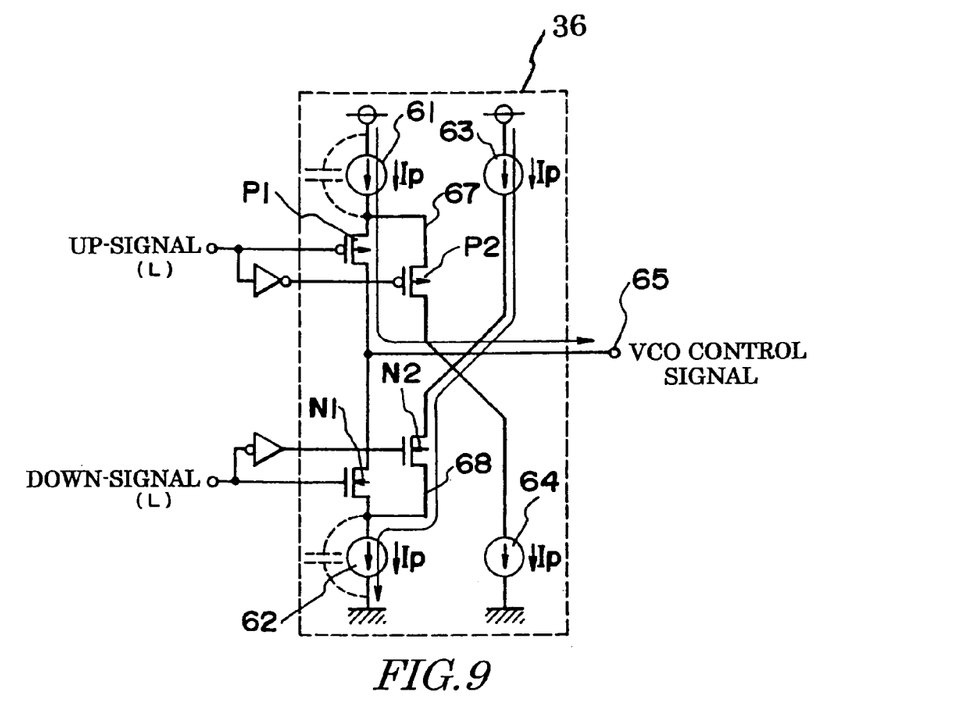
FIG. 9 is an explanatory view showing a current path in a charge state at the time of locking of the PLL circuit.

In the charge state, each of the transistor P1 and the transistor N2 is turned on, each of the transistor P2 and the transistor N1 is turned off, and the VCO control terminal 65 is charged with current Ip through the transistor P1, as shown in FIG. 9. Also in this case, the VCO control terminal 65 and the source 67 of the transistor P1 are connected to each other with a small potential difference. Also in this charge state, current flows through the charge pump circuit 36.

Figure 10:
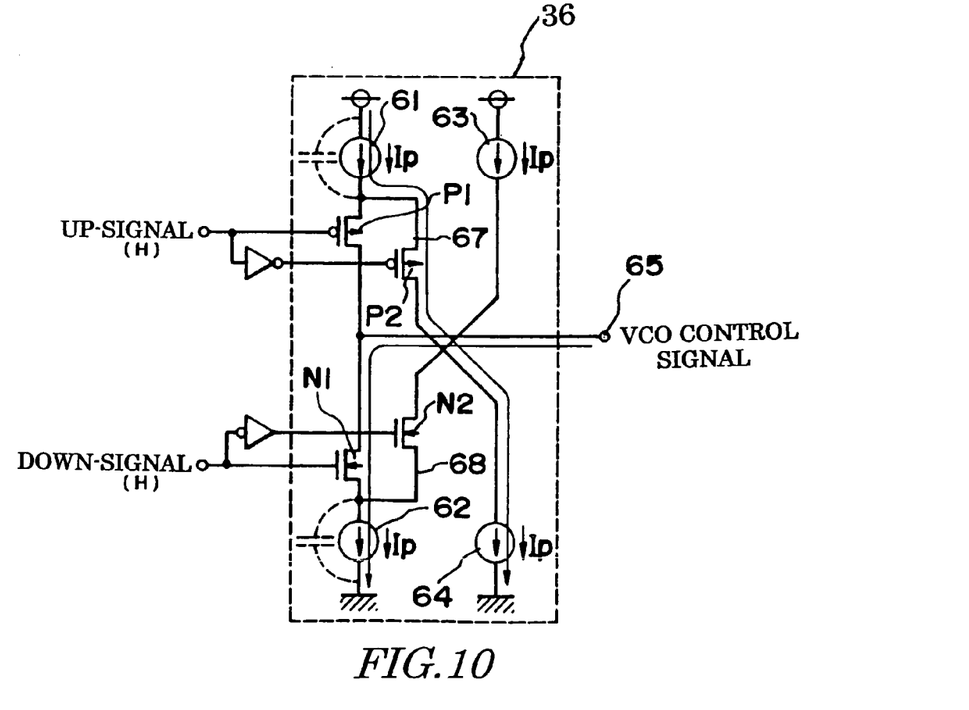
FIG. 10 is an explanatory view showing a current path in a discharge state at the time of locking of the PLL circuit.

In the discharge state, each of the transistor P2 and the transistor N1 is turned on, each of the transistor P1 and the transistor N2 is turned off, and the potential at the VCO control terminal 65 is discharged with current Ip through the transistor N1 as shown in FIG. 10. Also in this case, the VCO control terminal 65 and the source 68 of the transistor N1 are connected to each other with a small potential difference. Also in this discharge state, current flows through the charge pump circuit 36.

Figure 13:
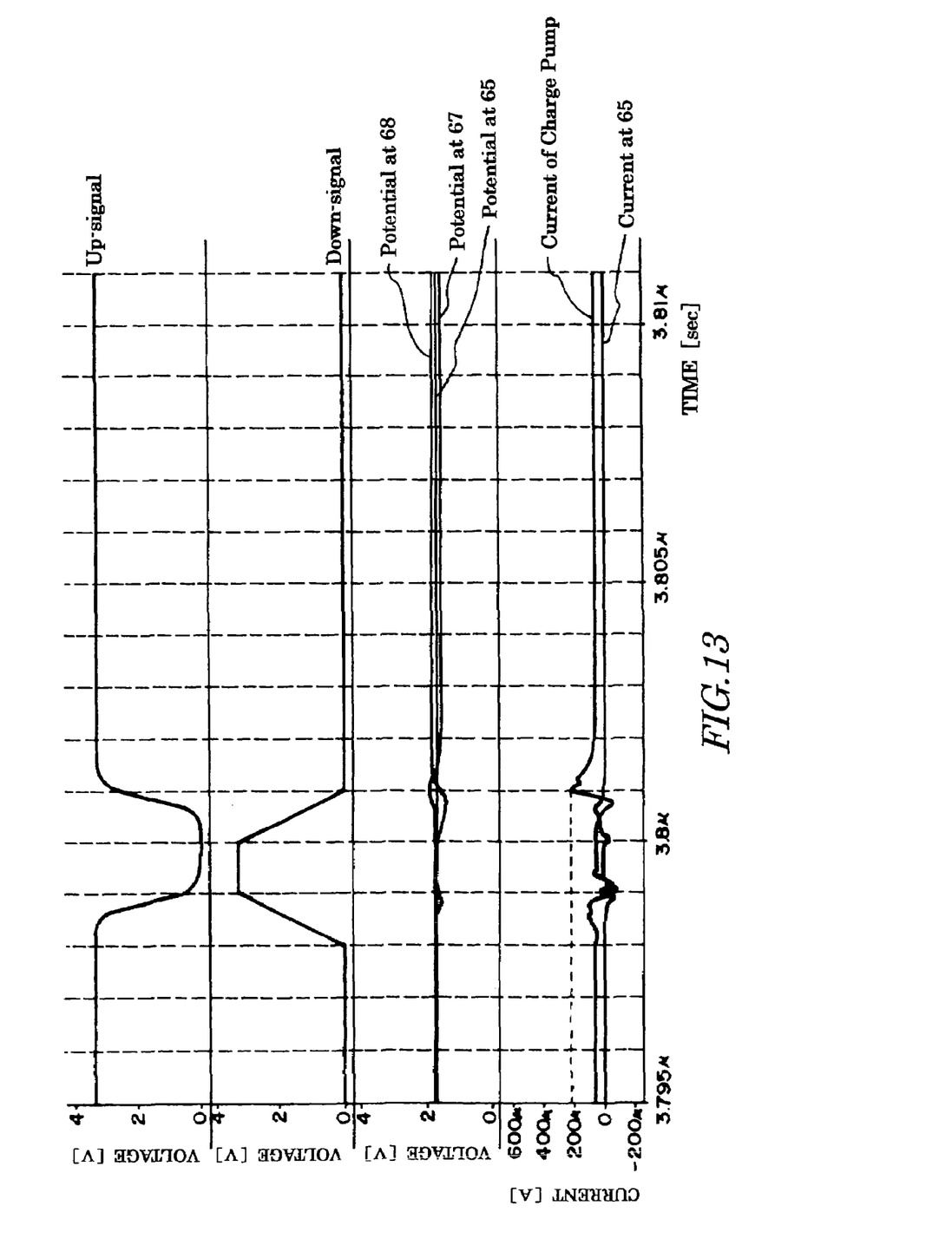
FIG. 13 is a waveform diagram showing a charging/ discharging operation at the time of locking of the PLL circuit according to the present embodiment.
Figure 14:
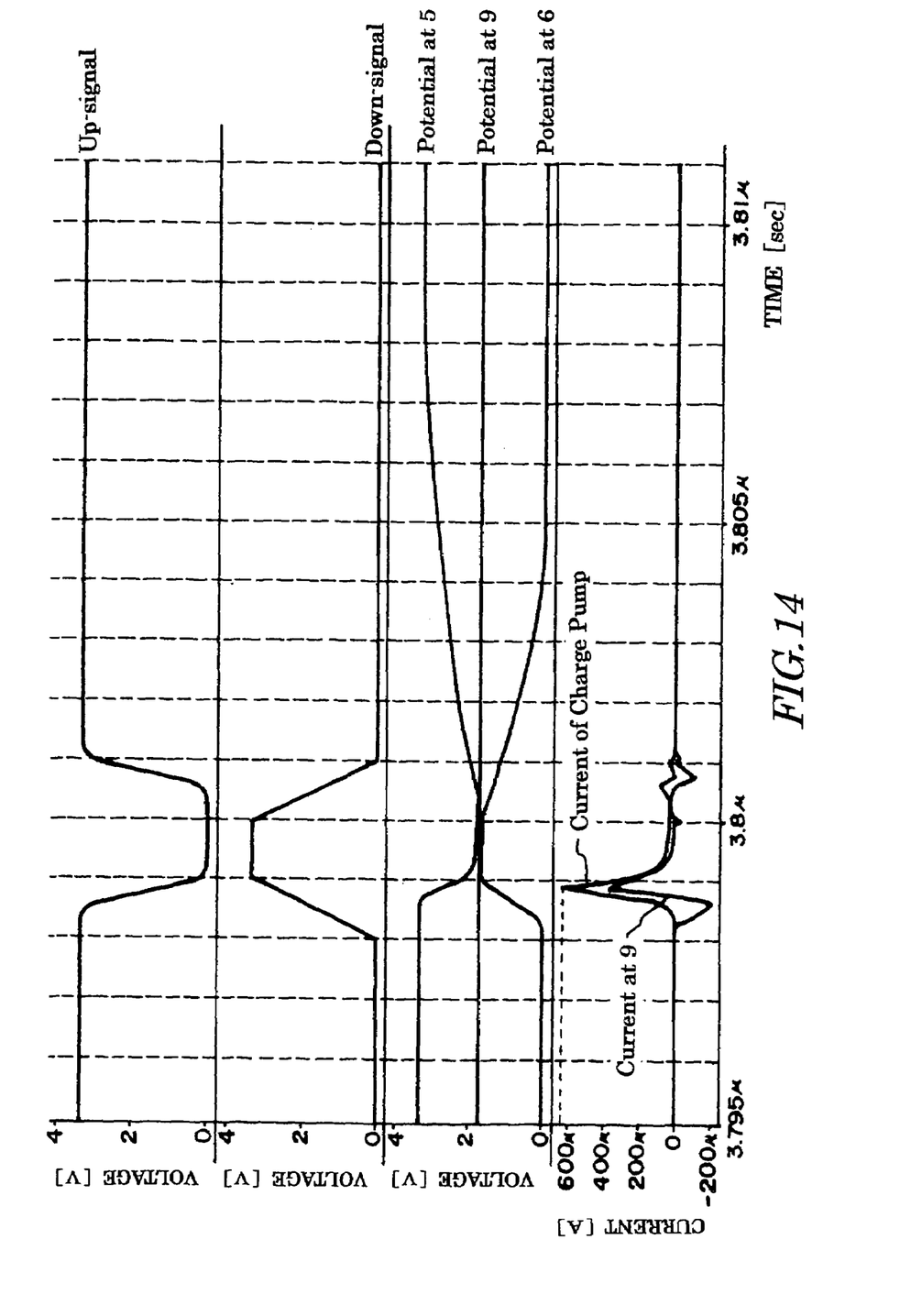
FIG. 14 is a waveform diagram showing a charging/ discharging operation at the time of locking of the PLL circuit in the conventional example shown in FIG. 1.

FIG. 13 shows a charging/discharging operation waveform at the time of locking of the PLL circuit in the present embodiment, and FIG. 14 illustrates a charging/discharging operation waveform at the time of locking of the PLL circuit in the conventional example shown in FIG. 1. As can be understood from both the drawings, it is found that in the present embodiment, noise and charge error generated in the charge pump circuit are reduced by not less than one-third as compared with those in the conventional example.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A charge pump circuit for providing a VCO control output, the charge pump circuit comprising:
   a low pass filter having a resistor and a first capacitance that are connected in series between a first output terminal and a ground terminal, and a second capacitance connected in parallel to the first capacitance between the first output terminal and the ground terminal the VCO control output being output from the first output terminal;
   a first P-channel MOS transistor having a source, a drain connected to the first output terminal and a gate receiving a first signal;
   a first N-channel MOS transistor having a source, a drain connected to the first output terminal and a gate receiving a second signal;
   another P-channel MOS transistor having a source, a drain connected to a second output terminal which is connected between the resistor and the first capacitance, and a gate receiving the first signal;
   another N-channel MOS transistor having a source, a drain connected to the second output terminal and a gate receiving the second signal;
   a first current source for providing a current of first level to the source of the first P-channel MOS transistor;
   a second current source for providing a current of second level to the source of the first N-channel MOS transistor;
   a third current source for providing a current of third level to the source of the another P-channel MOS transistor; and
   a fourth current source for providing a current of fourth level to the source of the another N-channel MOS transistor.

2. A charge pump circuit for receiving control signals from a control circuit that receives a first signal, a second signal and a lock detected signal of a phase comparison circuit output while a phase-locked loop circuit is in the lock state, comprising:
   a first P-channel MOS transistor having a source, a drain connected to a first output terminal and a gate receiving the first signal;
   a first N-channel MOS transistor having a source, a drain connected to the first output terminal and a gate receiving the second signal;
   a second P-channel MOS transistor having a source connected to the source of the first P-channel MOS transistor, a drain and a gate receiving an inverted signal of the first signal while the lock detected signal indicates locking;
   a second N-channel MOS transistor having a source connected to the source of the first N-channel MOS transistor, a drain and a gate receiving an inverted signal of the second signal while the lock detected signal indicates locking;
   a third P-channel MOS transistor having a source connected to the drain of the second N-channel MOS transistor, a drain connected to a second output terminal and a gate receiving the first signal while the lock detected signal indicates no locking;
   a third N-channel MOS transistor having a source connected to the drain of the second P-channel MOS transistor, a drain connected to the second output terminal and a gate receiving the second signal while the lock detected signal indicates no locking;
   a first current source for providing a current of first level to the source of the first P-channel MOS transistor;
   a second current source for providing a current of second level to the source of the first N-channel MOS transistor;
   a third current source for providing a current of third level to the drain of the second N-channel MOS transistor; and
   a fourth current source for providing a current of fourth level to the drain of the second P-channel MOS transistor.

3. A phase-locked loop circuit comprising:
   a charge pump circuit including:
      a first P-channel MOS transistor having a source, a drain connected to an output terminal and a gate receiving a first signal;
      a first, N-channel MOS transistor having a source, a drain connected to the output terminal and a gate receiving a second signal;
      a second P-channel MOS transistor having a source connected to the source of the first P-channel MOS transistor, a drain and a gate receiving an inverted signal of the first signal;
      a second N-channel MOS transistor having a source connected to the source of the first N-channel MOS transistor, a drain and a gate receiving an inverted signal of the second signal;
      a first current source for providing a current of first level to the source of the first P-channel MOS transistor;
      a second current source for providing a current of second level to the source of the first N-channel MOS transistor;
      a third current source for providing a current of third level to the drain of the second N-channel MOS transistor; and a fourth current source for providing a current of fourth level to the drain of the second P-channel MOS transistor;

a voltage controlled oscillator circuit for outputting a signal having a frequency depending on a voltage level of an input signal from the output terminal;

a reference signal source for generating a reference signal;

a first frequency division circuit for dividing a frequency of the reference signal;

a second frequency division circuit for dividing a frequency of the signal of the voltage controlled oscillator circuit;

a phase comparison circuit for comparing phases of the output signals of both the frequency division circuits to output an up-signal and a down-signal as said first and second signals, and for detecting a lock state to output the lock detected signal;

a control circuit for outputting control signals depending on the up-signal, the down-signal, and the lock detected signal of the phase comparison circuit, said control signals including the inverted first and second signals; and a low pass filter for attenuating a high frequency component of an output signal at the output terminal of the charge pump circuit to pass only a low frequency component of the output signal to the voltage controlled oscillator circuit.

4. The phase lock loop circuit including the charge pump of claim 1, and further comprising:

a voltage controlled oscillator circuit for outputting a signal having a frequency depending on a voltage level of an input signal from the VCO control output;

a reference signal source for generating a reference signal;

a first frequency division circuit for dividing a frequency of the reference signal;

a second frequency division circuit for dividing a frequency of the signal of the voltage controlled oscillator circuit;

a phase comparison circuit for comparing phases of the output signals of the first and second frequency division circuits to output an up-signal and a down-signal as said first and second signals, and for detecting a lock state to output a lock detected signal;

a control circuit for outputting control signals based on the up-signal, the down-signal, and the lock detected signal of the phase comparison circuit; and the low pass filter attenuate a high frequency component of an output signal at the first output terminal of the charge pump circuit 10 pass only a low frequency component to the voltage controlled oscillator circuit.

5. The phase lock loop circuit according to claim 4, wherein said control circuit is configured to effect the following:

apply said first signal to said another P-channel MOS transistor during an un-locked state indicated by said lock detected signal to turn on said another P-channel MOS transistor to effect charging of said first capacitance using current of said third current source, while simultaneously said first P-channel MOS transistor is turned on by said up-signal to effect charging of said first and second capacitances using said first current source; and apply said second signal to said another N-channel MOS transistor during the un-locked state indicated by said lock detected signal to turn on said another N-channel MOS transistor to effect discharging of said first capacitance using current of said fourth current source, while simultaneously said first N-channel MOS transistor is turned on by said down-signal to effect discharging charging of said first and second capacitances using said second current source.

6. The phase lock loop circuit including the charge pump of claim 2, and further comprising:

a voltage controlled oscillator circuit for outputting a signal having a frequency depending on a voltage level of an input signal from the first output terminal;

a reference signal source for generating a reference signal;

a first frequency division circuit for dividing a frequency of the reference signal;

a second frequency division circuit for dividing a frequency of the signal of the voltage controlled oscillator circuit;

the phase comparison circuit for comparing phases of the output signals of the first and second frequency division circuits to output an up-signal and a down-signal as said first and second signals, and for detecting a lock state to output the lock detected signal;

the control circuit for outputting the control signals depending on the up-signal, the down-signal, and the lock detected signal of the phase comparison circuit; and a low pass filter receiving output from the first and the second output terminals of the charge pump and attenuating a high frequency component of an output signal at the first output terminal of the charge pump circuit to pass only a low frequency component to the voltage controlled oscillator circuit.

7. The phase lock circuit according to claim 6, wherein:

the low pass filter comprises a resistor and a first capacitance that are connected in series between the first output terminal and a ground terminal, and a second capacitance connected in parallel to the first capacitance between the first output terminal and the ground terminal; and the second output terminal is connected to a junction between the first capacitance and resistor.

* * * * *